(12) United States Patent
Ogasawara

(10) Patent No.: US 7,326,943 B2
(45) Date of Patent: Feb. 5, 2008

(54) ELECTRON BEAM IRRADIATING APPARATUS AND IRRADIATING METHOD

(75) Inventor: Munehiro Ogasawara, Hiratsuka (JP)

(73) Assignee: Kabushiki Kaisha Toshiba, Tokyo (JP)

(*) Notice: Subject to any disclaimer, the term of this patent is extended or adjusted under 35 U.S.C. 154(b) by 208 days.

(21) Appl. No.: 11/348,238

(22) Filed: Feb. 7, 2006

(65) Prior Publication Data
US 2006/0192148 A1    Aug. 31, 2006

(30) Foreign Application Priority Data
Feb. 7, 2005    (JP) .............................. 2005-030787

(51) Int. Cl.
*H01J 37/304*    (2006.01)
(52) U.S. Cl. .............................. 250/492.22; 250/492.23
(58) Field of Classification Search ........... 250/492.22, 250/492.23, 396 R
See application file for complete search history.

(56) References Cited

U.S. PATENT DOCUMENTS 4,393,310 A * 7/1983 Hahn .......................... 250/398

7,122,809 B2 * 10/2006 Ogasawara ............ 250/492.22

FOREIGN PATENT DOCUMENTS

JP    8-316128    11/1996

OTHER PUBLICATIONS

M. Sumi et al., "Control of variable beam trapezoid delineator (VL-R2)," J. Vac. Sci. Technol. (Nov./Dec. 1981), pp. 1001-1006.

* cited by examiner

*Primary Examiner*—Kiet T. Nguyen
(74) *Attorney, Agent, or Firm*—Finnegan, Henderson, Farabow, Garrett & Dunner, L.L.P.

(57) ABSTRACT

It is made possible to prevent the color aberration at the lenses from increasing and prevent the current distribution on the sample surface from changing at the time of the blanking operation. A deflector is placed between the first and second shaping apertures. A first crossover image is formed between the first and second shaping apertures. A second crossover image is formed in the vicinity of the beam blanking aperture. The deflector placed between the first shaping aperture and the second shaping aperture includes at least two deflectors. A beam position on the beam blanking aperture is moved without moving the image of the first shaping aperture on the second shaping aperture, by deflecting the electron beam at the time of blanking.

16 Claims, 3 Drawing Sheets

ELECTRON BEAM IRRADIATING APPARATUS AND IRRADIATING METHOD

CROSS-REFERENCE TO RELATED APPLICATION

This application is based upon and claims the benefit of priority from prior Japanese Patent Application No. 2005-30787 filed on Feb. 7, 2005 in Japan, the entire contents of which are incorporated herein by reference.

BACKGROUND OF THE INVENTION

1. Field of the Invention

The present invention relates to en electron beam irradiating apparatus and an electron beam irradiating method.

2. Related Art

The technique of forming a fine pattern on a semiconductor substrate by using an electron beam is widely used for forming fine semiconductor structures and drawing mask patterns for optical lithography.

Typically, in conventional electron beam irradiating apparatuses, an electron beam emitted from an electron source is condensed by a condenser lens, and applied to a first shaping aperture. The electron beam passed through the first shaping aperture has a rectangular opening. A second shaping aperture is placed on a downstream side of the first shaping aperture. A projection lens and a shaping deflector are placed between the first and second shaping apertures. The projection lens is excited so as to form an image of the first shaping aperture on the second shaping aperture.

The shaping deflector is provided to change the position of the image of the first shaping aperture on the second shaping aperture. The shaping deflector shapes the cross section of the electron beam transmitted by the second shaping aperture to form a rectangle or a right-angled triangle having an arbitrary size by adjusting overlap between the image of the first shaping aperture and the second shaping aperture.

An object lens and an object deflector are placed on a downstream side of the second shaping aperture. A sample on which a pattern should be drawn is placed on a downstream side of them. The object lens forms a reduction image of the second shaping aperture. The object deflector changes the image forming position on the sample. A blanking deflector and a blanking aperture are placed between the condenser lens and the first shaping aperture. Control as to whether to apply the electron beam to the sample is exercised by applying an electric field to the blanking deflector and intercepting the electron beam with the blanking aperture.

When an electron beam propagates in the space, scattering of electrons is caused by interaction between electrons. It is known that this widens the energy distribution of the electron beam. As the beam current increases, the spread becomes larger, resulting in an increase in chromatic aberration at lenses. The beam current emitted from the electron gun has a value of, for example, approximately 100 μA, and the beam current transmitted by the first shaping aperture has a value of approximately 3 μA. For preventing the increase in chromatic aberration, therefore, it is desirable to shorten a portion in which the beam current is large, i.e., the distance between the electron gun and the first shaping aperture. In the case where the blanking deflector is placed on the upstream side of the first shaping aperture, however, there is a limit in the distance shortening.

On the other hand, an example in which the blanking deflector is installed between the first shaping aperture and the second shaping aperture is shown in Japanese Patent Application Laid-Open Publication No. 8-316128. In this example, the image of the first shaping aperture on the second shaping aperture moves at the time of the blanking operation, resulting in a problem that the current distribution on the sample changes.

If the blanking deflector is placed on the upstream side than the first shaping aperture in the conventional electron beam irradiating apparatus, it becomes necessary to lengthen the portion in the barrel through which a large current beam flows, resulting in a problem of increased chromatic aberration at the lenses. If the blanking deflector is placed on the downstream side than the first shaping aperture, there is a problem that the current distribution on the sample surface changes at the time of blanking operation.

SUMMARY OF THE INVENTION

In view of the above-described situations, the present invention has been achieved.

An object of the present invention is to provide an electron beam irradiating apparatus, and method, capable of reducing the chromatic aberration at the lenses and preventing the current distribution non-uniformity on the sample surface from changing at the time of the blanking operation.

An electron beam irradiating apparatus according to a first aspect of the present invention includes: an electron source which generates an electron beam; a first shaping aperture which shapes a cross section of the electron beam emitted from the electron source; a second shaping aperture which shapes a cross section of the electron beam passed through the first shaping aperture; a projection lens which forms an image of the first shaping aperture on the second shaping aperture; a deflector placed between the first and second shaping apertures; an object lens which forms an image of the second shaping aperture on a surface of a sample placed on a downstream side of the second shaping aperture; and a beam blanking aperture placed between the second shaping aperture and the object lens, a first crossover image being formed between the first and second shaping apertures, a second crossover image being formed in vicinity of the beam blanking aperture, the deflector placed between the first shaping aperture and the second shaping aperture including at least two deflectors, and a beam position on the beam blanking aperture being moved without moving the image of the first shaping aperture on the second shaping aperture, by deflecting the electron beam at time of blanking.

The projection lens can include a first lens placed on a first shaping aperture side and a second lens placed on a second shaping aperture side, and a magnetic field of the second lens directed from an upstream side to a downstream side is opposite to a magnetic field of the first lens directed from the upstream side to the downstream side.

The electron beam irradiating apparatus further can include another deflector having a deflection center which substantially coincides with a position of the first crossover image.

The at least two deflectors can has a function of conducting shaping deflection so as to make the first crossover image immobile.

The electron beam irradiating apparatus can include a condenser lens which condenses the electron beam emitted from the electron source, applies the electron beam to the first shaping aperture, and forms the first crossover image between the first shaping aperture and the second shaping aperture.

The projection lens can include one set of projection lenses, and the one set of projection lenses can be placed between the two deflectors.

An electron beam irradiating method according to a second aspect of the present invention includes: shaping a cross section of an electron beam emitted from an electron source, by using a first shaping aperture; forming a first crossover image; deflecting an electron beam passed through the first shaping aperture, by using at least two deflectors, and forming an image of the first shaping aperture on a second shaping aperture by using a projection lens; shaping a cross section of the electron beam formed on the second shaping aperture as an image, by using the second shaping aperture; forming an image of the second crossover in vicinity of a beam blanking aperture placed on a downstream side of the second shaping aperture; and forming an image on a surface of a sample placed on a downstream side of the beam blanking aperture, by using an object lens, a beam position on the beam blanking aperture being moved without moving the image of the first shaping aperture on the second shaping aperture, by deflecting the electron beam by using the deflectors at time of blanking.

DETAILED DESCRIPTION OF THE EMBODIMENTS

Hereafter, embodiments of the present invention will be described with reference to the drawings.

First Embodiment

Figure 1:
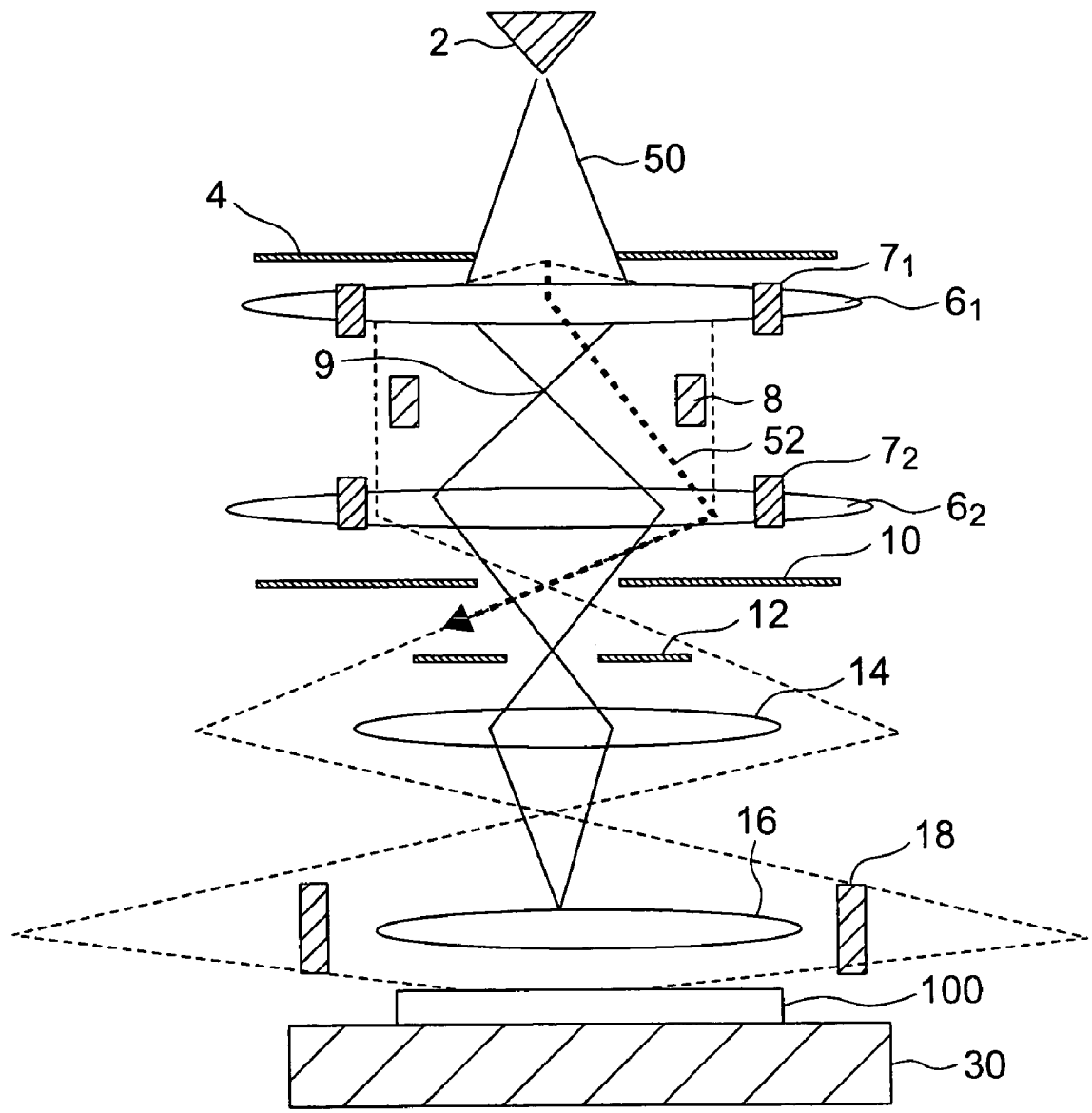
FIG. 1 is a schematic diagram showing an electron beam irradiating apparatus according to a first embodiment of the present invention.

FIG. 1 shows an electron beam irradiating apparatus according to a first embodiment of the present invention. The electron beam irradiating apparatus according to this embodiment includes an electron beam source 2, a first shaping aperture 4, projection lenses $6_1$ and $6_2$, blanking deflectors $7_1$ and $7_2$, a shaping deflector 8, a second shaping aperture 10, a blanking aperture 12, a compression lens 14, an object lens 16, an object deflector 18, and a stage 30 on which a sample 100 is placed and which can move in a horizontal direction (a direction perpendicular to paper).

An electron beam 50 having energy of 50 kV emitted from the electron source 2 is irradiated on the first shaping aperture 4. As the first shaping aperture 4, for example, a thin silicon membrane having a thickness of 20 μm provided with an opening and coated with gold on the surface is used. The electron beam 50 transmitted through the fist shaping aperture 4 is shaped to have a rectangular cross section. The spacing between the first shaping aperture 4 and the second shaping aperture 10 is, for example, 300 mm. Between them, two projection lenses $6_1$ and $6_2$ are placed on 50 mm downstream side and 250 mm downstream side of the first shaping aperture 4, respectively. The projection lens $6_1$ on the upstream side and the projection lens $6_2$ on the downstream side are vertically symmetrical in structure and excited with approximately 730 ampere-turns in opposite directions. The projection lenses $6_1$ and $6_2$ form an image of the first shaping aperture 4 on the second shaping aperture 10 with magnification of unity and without rotation. By moving the image of the first shaping aperture 4 on the second shaping aperture 10 by using the shaping deflector 8, it is possible to adjust the overlap the image of the first shaping aperture 4 with the second shaping aperture 10 and change the dimension of the electron beam 50 transmitted by the second shaping aperture 10. Here, the crossover image forming position 9 obtained using the projection lens $6_1$ on the upstream side coincides with a deflection center of the shaping deflector 8. In the present embodiment, the crossover image forming position 9 is an intermediate position between the first shaping aperture 4 and the second shaping aperture 10.

On the other hand, two blanking deflectors $7_1$ and $7_2$ are placed on the upstream side and the downstream side of the shaping deflector 8. The crossover image forming position 9 is moved as represented by a trajectory 52 of the electron beam indicated by a dotted line in FIG. 1 by the two blanking deflectors $7_1$ and $7_2$ at the time of blanking. If a change in the position of the image of the first shaping aperture 4 on the second shaping aperture 10 is prevented, the non-uniformity in the beam current distribution on the sample 100 at the time of blanking can be suppressed. Deflection conducted by the blanking deflectors $7_1$ and $7_2$ is determined by taking the deflection conducted by the projection lenses $6_1$ and $6_2$ as well into consideration. The two blanking deflectors $7_1$ and $7_2$ have a structure in which the length is 30 mm and the interval between electrodes is 6 mm. The azimuthal direction of the deflection and the deflection strength are adjusted so as to cancel the movement of the image position of the first shaping aperture 4 caused on the second shaping aperture 10 by respective deflections. For example, the condition can be satisfied by installing the deflectors $7_1$ and $7_2$ having the same structure in vertically symmetrical positions with the phase angle changed by 180 degrees.

According to the present embodiment, the blanking deflector is not placed on the upstream side of the first shaping aperture 4 as heretofore described. Therefore, it becomes possible to shorten the large current region and prevent the chromatic aberration at the lenses from increasing. Furthermore, two blanking deflectors are provided, and the azimuthal direction of the deflection and the deflection strength are adjusted so as to cancel the movement of the image position of the first shaping aperture caused on the second shaping aperture by respective deflections. At the time of blanking operation, therefore, non-uniformity of the current distribution on the sample surface can be suppressed.

Second Embodiment

Figure 2:
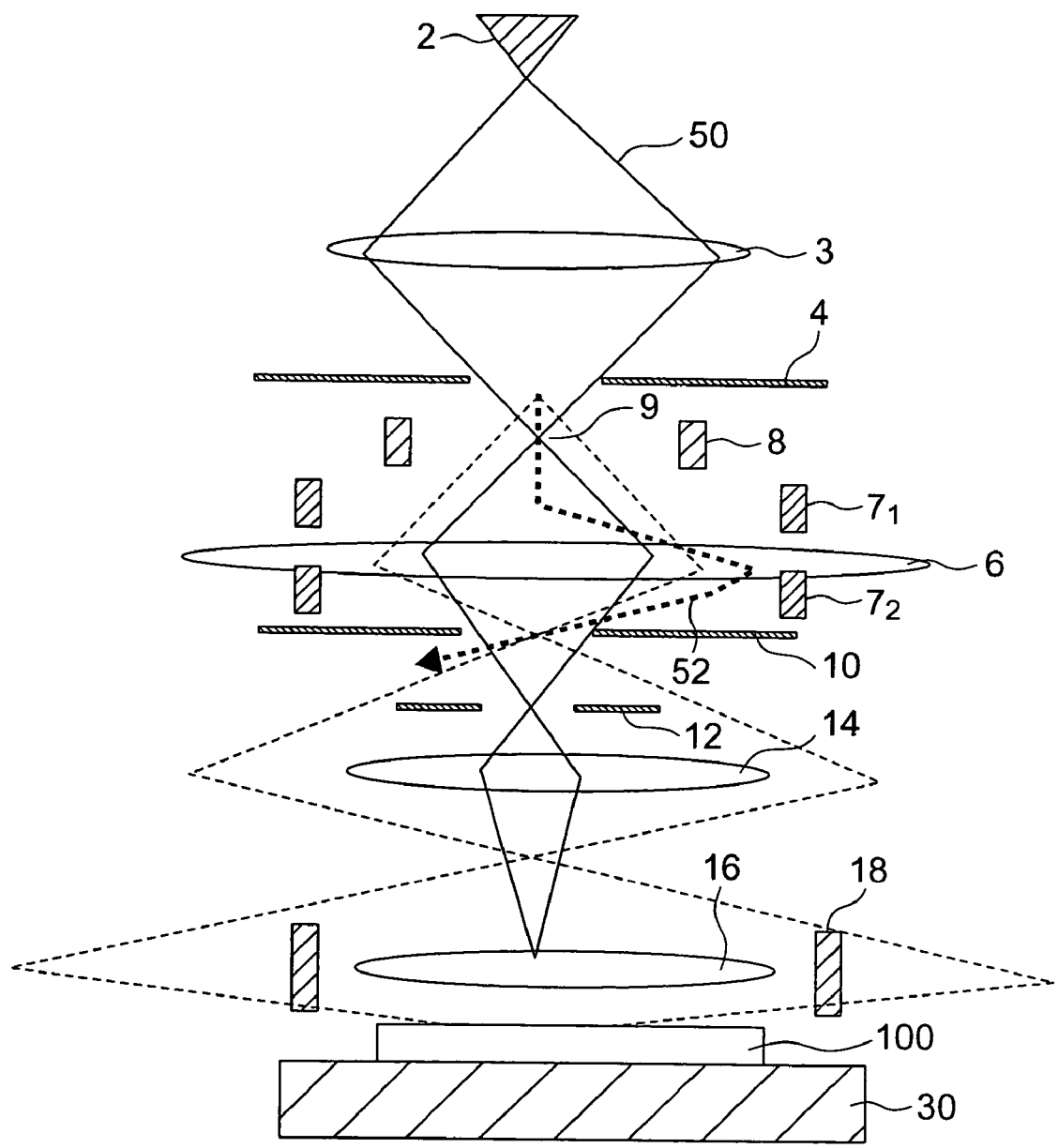
FIG. 2 is a schematic diagram showing an electron beam irradiating apparatus according to a second embodiment of the present invention.

FIG. 2 shows a configuration of an electron beam irradiating apparatus according to a second embodiment of the present invention. The electron beam irradiating apparatus according to this embodiment includes an electron beam source 2, a condenser lens 3, a first shaping aperture 4, a projection lens 6, blanking deflectors $7_1$ and $7_2$, a shaping deflector 8, a second shaping aperture 10, a blanking aperture 12, a compression lens 14, an object lens 16, an object deflector 18, and a stage 30 on which a sample 100 is placed and which can move in a horizontal direction (a direction perpendicular to paper).

In this embodiment, one projection lens 6 is provided, and the two blanking deflectors $7_1$ and $7_2$ are placed on the downstream side of the shaping deflector 8.

The spacing between the first shaping aperture 4 and the second shaping aperture 10 is 300 mm. The projection lens 6 is placed on 200 mm downstream side of the first shaping aperture. The crossover 9 is in a position of 100 mm downstream of the first shaping aperture 4. The blanking deflectors $7_1$ and $7_2$ are placed so as to have center positions of electrodes in positions of 150 mm and 250 mm downstream side of the first shaping aperture 4, respectively. The projection lens 6 has a magnification of ½. The ratio of the distance between the first shaping aperture 4 and the blanking deflector $7_1$ on the upstream side to the distance between the second shaping aperture 10 and the blanking deflector $7_2$ on the upstream side is 3:1. Therefore, the deflection sensitivity of the blanking deflector $7_1$ on the upstream side is set equal to ⅔ of the deflection sensitivity of the blanking deflector $7_2$ on the upstream side. In order to take in the influence of the image caused by the projection lens 6, the difference in the azimuthal direction of the deflection between the two blanking deflectors, which is hereafter called the deviation angle, is not 180 degrees but approximately 208.7 degrees. By the way, the deviation angle is a value depending upon the excitation of the projection lens 6. In the present embodiment, the deviation angle is a value obtained when the excitation of the projection lens 6 is 631 ampere-turns.

According to the present embodiment, the blanking deflector is not placed on the upstream side of the first shaping aperture 4 in the same way as the first embodiment. Therefore, it becomes possible to shorten the large current region and prevent the chromatic aberration at the lenses from increasing. Furthermore, two blanking deflectors are provided, and the deflection phase and the deflection strength are adjusted so as to cancel the movement of the image position of the first shaping aperture caused on the second shaping aperture by respective deflections. At the time of blanking operation, therefore, non-uniformity of the current distribution on the sample surface can be suppressed.

Third Embodiment

Figure 3:
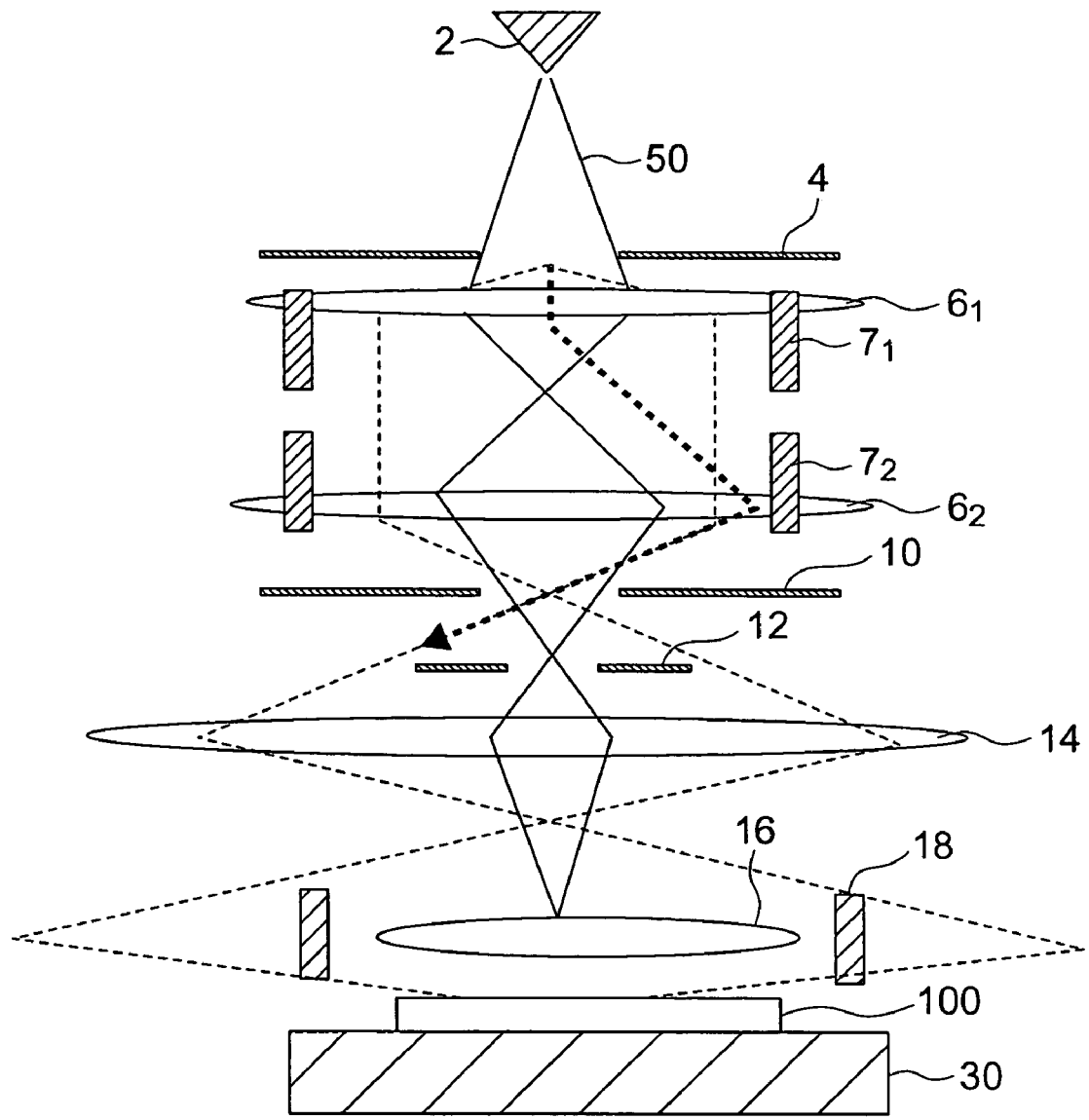
FIG. 3 is a schematic diagram showing an electron beam irradiating apparatus according to a third embodiment of the present invention.

FIG. 3 shows a configuration of an electron beam irradiating apparatus according to a third embodiment of the present invention. The electron beam irradiating apparatus according to this embodiment has a configuration obtained by removing the shaping deflector 8 and making the blanking deflectors $7_1$ and $7_2$ perform the function of the shaping deflector 8 in the electron beam irradiating apparatus according to the first embodiment shown in FIG. 1.

The two blanking deflectors $7_1$ and $7_2$ are provided with the same structure and placed in vertically symmetrical positions. When conducting shaping deflection, the two blanking deflectors conduct the deflection to the same phase so as to make the crossover image immobile. When conducting the blanking, the two blanking deflectors conduct the deflection so as to deviate the phases from each other by 180 degrees so as to prevent the position of the image of the first shaping aperture 4 on the second shaping aperture 10 from moving. The two actions are activated in a simultaneous manner, so that the image of the first shaping aperture on the second shaping aperutre does not move, while the position of the cross over image in the vicinity of the blanking aperture moves. Therefore, the beam shape does not change during the blanking operation. Owing to such a configuration, the number of needed deflectors can be decreased and the structure can be simplified.

According to the third embodiment, the blanking deflector is not placed on the upstream side of the first shaping aperture 4 in the same way as the first embodiment. Therefore, it becomes possible to shorten the large current region and prevent the chromatic aberration at the lenses from increasing. Furthermore, two blanking deflectors are provided, and the deflection phase and the deflection strength are adjusted so as to cancel the movement of the image position of the first shaping aperture caused on the second shaping aperture by respective deflections. At the time of blanking operation, therefore, variation of the current distribution on the sample surface can be suppressed.

According to the embodiments of the present invention, it is possible to obtain an electron beam irradiating apparatus capable of preventing the color aberration at the lenses from increasing and preventing the current distribution on the sample surface from changing at the time of the blanking operation.

The present invention is not restricted to the first to third embodiments. A configuration other than the configurations according to the first to third embodiments is also possible as long as the electron beam is deflected to conduct blanking so as to make the movement of the image position of the first shaping aperture on the second shaping aperture small by using the blanking deflector placed between the two shaping apertures. Instead of the two deflectors, three or more deflectors may be combined. Furthermore, it is also possible to raise the blanking efficiency by activating the blanking deflector so as to make the image of the first shaping aperture on the second shaping aperture immobile and then activating the shaping deflector to conduct deflection so as to prevent the electron beam from passing through the aperture of the second shaping aperture.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. An electron beam irradiating apparatus comprising:

an electron source which generates an electron beam;

a first shaping aperture which shapes a cross section of the electron beam emitted from the electron source;

a second shaping aperture which shapes a cross section of the electron beam passed through the first shaping aperture;

a projection lens which forms an image of the first shaping aperture on the second shaping aperture;

a deflector placed between the first and second shaping apertures;

an object lens which forms an image of the second shaping aperture on a surface of a sample placed on a downstream side of the second shaping aperture; and a beam blanking aperture placed between the second shaping aperture and the object lens, a first crossover image being formed between the first and second shaping apertures, a second crossover image being formed in vicinity of the beam blanking aperture, the deflector placed between the first shaping aperture and the second shaping aperture including at least two deflectors, and a beam position on the beam blanking aperture being moved without moving the image of the first shaping aperture on the second shaping aperture, by deflecting the electron beam at time of blanking.

2. The electron beam irradiating apparatus according to claim 1, wherein the projection lens comprises a first lens placed on a first shaping aperture side and a second lens placed on a second shaping aperture side, and a magnetic field of the second lens directed from an upstream side to a downstream side is opposite to a magnetic field of the first lens directed from the upstream side to the downstream side.

3. The electron beam irradiating apparatus according to claim 2, further comprising another deflector having a deflection center which substantially coincides with a position of the first crossover image.

4. The electron beam irradiating apparatus according to claim 2, wherein the at least two deflectors have a function of conducting shaping deflection so as to make the first crossover image immobile.

5. The electron beam irradiating apparatus according to claim 4, comprising a condenser lens which condenses the electron beam emitted from the electron source, applies the electron beam to the first shaping aperture, and forms the first crossover image between the first shaping aperture and the second shaping aperture.

6. The electron beam irradiating apparatus according to claim 1, further comprising another deflector having a deflection center which substantially coincides with a position of the first crossover image.

7. The electron beam irradiating apparatus according to claim 6, wherein the projection lens comprises one set of projection lenses, and the one set of projection lenses is placed between the two deflectors.

8. The electron beam irradiating apparatus according to claim 1, wherein the at least two deflectors have a function of conducting shaping deflection so as to make the first crossover image immobile.

9. The electron beam irradiating apparatus according to claim 8, comprising a condenser lens which condenses the electron beam emitted from the electron source, applies the electron beam to the first shaping aperture, and forms the first crossover image between the first shaping aperture and the second shaping aperture.

10. The electron beam irradiating apparatus according to claim 1, wherein the projection lens comprises one set of projection lenses, and the one set of projection lenses is placed between the two deflectors.

11. An electron beam irradiating method comprising:

shaping a cross section of an electron beam emitted from an electron source, by using a first shaping aperture;

forming a first crossover image;

deflecting an electron beam passed through the first shaping aperture, by using at least two deflectors, and forming an image of the first shaping aperture on a second shaping aperture by using a projection lens;

shaping a cross section of the electron beam formed on the second shaping aperture as an image, by using the second shaping aperture;

forming an image of a second crossover in vicinity of a beam blanking aperture placed on a downstream side of the second shaping aperture; and forming an image on a surface of a sample placed on a downstream side of the beam blanking aperture, by using an object lens, a beam position on the beam blanking aperture being moved without moving the image of the first shaping aperture on the second shaping aperture, by deflecting the electron beam by using the deflectors at time of blanking.

12. The electron beam irradiating method according to claim 11, wherein the projection lens comprises a first lens placed on a first shaping aperture side and a second lens placed on a second shaping aperture side, and a magnetic field of the second lens directed from an upstream side to a downstream side is opposite to a magnetic field of the first lens directed from the upstream side to the downstream side.

13. The electron beam irradiating method according to claim 11, wherein a deflection center is caused to substantially coincide with a position of the first crossover image by another deflector.

14. The electron beam irradiating method according to claim 11, wherein the at least two deflectors conduct shaping deflection so as to make the first crossover image immobile.

15. The electron beam irradiating method according to claim 14, comprising the step of condensing the electron beam emitted from the electron source, by using a condenser lens, applying the electron beam to the first shaping aperture, and forming the first crossover image between the first shaping aperture and the second shaping aperture.

16. The electron beam irradiating method according to claim 11, wherein the projection lens comprises one set of projection lenses, and the one set of projection lenses is placed between the two deflectors.

* * * * *